(12) United States Patent
Loh et al.

(10) Patent No.: US 9,196,504 B2
(45) Date of Patent: Nov. 24, 2015

(54) THERMAL LEADLESS ARRAY PACKAGE WITH DIE ATTACH PAD LOCKING FEATURE

(75) Inventors: Albert Loh, Fremont, CA (US); Edward Then, Penang (MY); Serafin Pedron, Jr., Manteca, CA (US); Saravuth Sirinorakul, Bangkok (TH)

(73) Assignee: UTAC DONGGUAN LTD., Dongguan (CN)

( * ) Notice: Subject to any disclaimer, the term of this patent is extended or adjusted under 35 U.S.C. 154(b) by 149 days.

(21) Appl. No.: 13/541,561

(22) Filed: Jul. 3, 2012

(65) Prior Publication Data

US 2014/0008777 A1    Jan. 9, 2014

(51) Int. Cl.
*H01L 21/48* (2006.01)
*H01L 23/495* (2006.01)
*H01L 23/31* (2006.01)
*H01L 23/00* (2006.01)

(52) U.S. Cl.
CPC ........ *H01L 21/4832* (2013.01); *H01L 23/3142* (2013.01); *H01L 23/49541* (2013.01); *H01L 23/3107* (2013.01); *H01L 24/32* (2013.01); *H01L 24/48* (2013.01); *H01L 2224/32245* (2013.01); *H01L 2224/48091* (2013.01); *H01L 2224/48247* (2013.01); *H01L 2224/73265* (2013.01); *H01L 2224/85444* (2013.01); *H01L 2224/85455* (2013.01); *H01L 2224/85464* (2013.01); *H01L 2224/97* (2013.01)

(58) Field of Classification Search
CPC ............ H01L 21/4821; H01L 21/4832; H01L 2021/60; H01L 23/49805
See application file for complete search history.

(56) References Cited

U.S. PATENT DOCUMENTS

| | | | |
|---|---|---|---|
| 6,229,200 B1 | 5/2001 | McLellan et al. | |
| 6,348,726 B1 | 2/2002 | Bayan et al. | |
| 6,498,099 B1 | 12/2002 | McLellan et al. | |
| 6,784,547 B2 | 8/2004 | Pepe et al. | |
| 6,967,125 B2 | 11/2005 | Fee et al. | |
| 7,033,517 B1 | 4/2006 | Fan et al. | |
| 7,049,177 B1 | 5/2006 | Fan et al. | |
| 7,102,241 B2 | 9/2006 | Tao | |
| 7,247,526 B1 | 7/2007 | Fan et al. | |
| 7,364,941 B2 | 4/2008 | Usui et al. | |
| 7,473,586 B1 | 1/2009 | Lo et al. | |
| 7,732,258 B2 | 6/2010 | Kim | |
| 2006/0186515 A1* | 8/2006 | Punzalan et al. | 257/666 |
| 2007/0054438 A1 | 3/2007 | Huang et al. | |
| 2010/0276792 A1 | 11/2010 | Chi et al. | |
| 2011/0049685 A1* | 3/2011 | Park et al. | 257/660 |
| 2011/0057298 A1* | 3/2011 | Ramos et al. | 257/667 |
| 2012/0018866 A1* | 1/2012 | Camacho et al. | 257/676 |
| 2012/0126384 A1* | 5/2012 | Meng | 257/670 |

* cited by examiner

*Primary Examiner* — Jae Lee
(74) *Attorney, Agent, or Firm* — Haverstock & Owens LLP

(57) ABSTRACT

Embodiments of the present invention are directed to a thermal leadless array package with die attach pad locking feature and methods of producing the same. A copper layer is half-etched on both surfaces to define an array of package contacts and a die attach pad. Each die attach pad is fully embedded in encapsulate material to provide a positive mechanical locking feature for better reliability. In some embodiments, the contacts include four active corner contacts.

11 Claims, 11 Drawing Sheets

THERMAL LEADLESS ARRAY PACKAGE WITH DIE ATTACH PAD LOCKING FEATURE

FIELD OF THE INVENTION

The present invention is related to the field of semiconductor device manufacturing. More specifically, the present invention relates to a thermal leadless array package with die attach pad locking feature and methods of producing the same.

BACKGROUND

Current processes and technologies for thermal leadless array (TLA) packages yields structural features in which die attach pads (DAP) are only partially embedded in the molding compound to serve as a mechanical locking feature to counter thermal and mechanical stresses due to CTE (coefficient of thermal expansion) mismatches between the various components within the package. Typically, the shear stress between the various components can result in failure during environmental stressing or board level reliability testing. This is especially true for packages with a big die-to-DAP area ratio (typically 85% or greater). An existing process of forming TLA packages is disclosed in U.S. Pat. No. 7,049,177 to Fan et al. Fan teaches a process of forming TLA packages that involves double half etch steps. However, this process has deficiencies due to the fact that both the DAP and contacts are only partly embedded in the molding compound for mechanical locking FIG. 1 illustrates a side view of a multi-row leadless package in the prior art. The prior art semiconductor package 100 includes a die attach pad 105, contacts 110, an IC chip 115 mounted on the die attach pad 105, and wirebonds 125 bonding the chip 115 to the contacts 110. Molding compound 120 encapsulates the wirebonds 125 and the IC chip 115. The contacts 110 and the die attach pad 105 are not fully embedded in and are protruding from the bottom of the molding compound 120. When compared to a standard QFN package where the contacts and DAP are fully embedded (only a single face is exposed for connection and thermal transfer), TLA's reliability performance is less robust.

One solution is disclosed in U.S. Pat. No. 6,498,099 to McLellan et al. McLellan teaches metal buildup on a sacrificial carrier. The sacrificial carrier which is then etched away after encapsulation. The method used during buildup results in the DAP and leads having mushroom shape profile as a locking feature. However, the metal build-up process takes a long time and is therefore not price-competitive.

Other solutions are described in U.S. Pat. No. 7,033,517 to Fan et al. and U.S. Pat. No. 7,247,526 to Fan et al. In these documents, two metal foils (namely, a leadframe strip and a carrier strip) are laminated together and subsequently separated after encapsulation. The leadframe strip is first patterned and half etched on one surface prior to laminating the same surface onto the carrier strip. The non-patterned side of the leadframe strip is patterned and etched to fully define the individual I/O leads and DAP. After assembly and encapsulation, the carrier strip is removed using a heated process. The resulting structure has a fully embedded DAP but does not provide stand-off leads like TLA to facilitate soldering and mounting to a PCB.

Further, a drawback arises with a standard single row QFN package having embedded tie bars that extend from the DAP to the four corner contact pads of the package leadframe. Typically, these tie bars are left behind after the assembly process. Unfortunately, these tie bars that are left behind after the assembly process take up valuable footprint space. FIG. 4 illustrates a bottom view of the single row leadless package in the prior art. As shown, there are 32 contacts that surrounds a die attach pad 415, with eight contacts 405 exposed at the side. However, valuable footprint space at the corners 410 of the package 400 remain unused.

The present invention addresses at least these limitations in the prior art.

SUMMARY OF THE DISCLOSURE

Embodiments of the present invention are directed to a thermal leadless array package with die attach pad locking feature and methods of producing the same. A copper layer is half-etched on both surfaces to define an array of package contacts and a die attach pad. Each die attach pad is fully embedded in encapsulating material to provide a positive mechanical locking feature for better reliability. The first half etching is done on a top surface of a leadframe to form the contacts and the die attach pad. For this document, top surface is intended to mean the surface to which the semiconductor die is attached rather than a cardinal direction. The second half-etching is done on a bottom surface of the leadframe between edges of the die attach pad and the nearest row of contacts. This area is etched through, with the exception of support structures (e.g., tie bars). In some embodiments, each tie bar is substantially at the center of each side of the die attach pad. Alternatively, each tie bar is substantially at the corner of the die attach pad. This single-layer leadframe substrate can then be used for assembling leadless semiconductor packages. The remainder of the package assembly processes (e.g., die attach, wire bond, molding, marking and/or strip testing) can be done using standard QFN processes and equipments. Back etching is done in strip form to define and isolate the individual contacts from one another and from the die attach pad.

In one aspect, a semiconductor package includes a die attach pad, a plurality of contacts, a semiconductor die mounted on an inner surface of the die attach pad, wire bonds coupling the semiconductor die to the plurality of contacts, and molding compound. The die attach pad typically includes the inner surface and an exposed surface. The plurality of contacts typically includes inner contacts that are closer to the die attach pad. The molding compound typically includes a first bottom surface, which extends from the exposed surface of the die attach pad towards the inner contacts. In some embodiments, the first bottom surface of the molding compound reaches the inner contacts. Alternatively, the first bottom surface of the molding compound does not reach the inner contacts. The die attach pad is embedded in the molding compound such that the first bottom surface is coplanar with the exposed surface of the die attach pad, bottom surfaces of the contacts or both. The first bottom surface of the molding compound at least partially circumscribes the die attach pad. The molding compound can also include a second bottom surface, which is typically recessed with respect to the exposed surface of the die attach pad, the bottom surfaces of the contacts or both. The transition between the first and second bottom surfaces of the die attach pad is referred to as a step feature of the semiconductor package. The step feature can occur before the inner contacts or at the edge of the inner contacts.

In some embodiments, the first bottom surface of the molding compound extends from the die attach pad to reach the inner contacts, and is coplanar with the exposed surface of the die attach pad and/or the bottom surfaces of the inner contacts. The molding compound between the die attach pad and the inner contacts includes a step feature occurring at the edge of the inner contacts.

Alternatively, the first bottom surface of the molding compound extends from the die attach pad but does not reach the inner contacts, leaving a gap between the first bottom surface of the molding compound and the bottom surfaces of the inner contacts. The molding compound between the die attach pad and the inner contacts includes a step feature occurring before the inner contacts.

In some embodiments, the inner contacts are partially encapsulated. In some embodiments, the plurality of contacts protrude from the molding compound. In some embodiments, the die attach pad and the plurality of contact pads have an engaging feature. In some embodiments, the plurality of contacts include corner contacts that are active.

In another aspect, a method is directed towards fabricating a semiconductor package. A leadframe is etched to form a plurality of tie bars, a plurality of contacts and a die attach pad coupled to a portion of the plurality of contacts via the plurality of tie bars, and to form a plurality of areas around the die attach pad that is etched through the leadframe. In some embodiment, a top surface of the leadframe is selectively plated and the bottom surface of the leadframe is laminated with tape. The top surface can be plated with Ag, a stack-up of Ni, Pd and Au, NiPdAu alloy, NiAu, or NiAu alloy, or other suitable platings. The semiconductor package is then prepared. Typically, a die is coupled to the die attach pad, bond pads on the die are wirebonded to the plurality of contacts. Then, the die attach pad, the plurality of contacts, the die and wirebonds are encapsulated. In some embodiments, after the package is prepared, the tape is removed from the bottom surface of the leadframe. The bottom surface of the leadframe is further etched to isolate the plurality of contacts from the die attach pad. In some embodiments, solderable material is applied to the bottom surface of the leadframe. The solderable material is Sn, NiAu, NiPdAu, Ag, SnPb, SnAgCu, SnAg-CuNi, Pb-free compositions, or other suitable material. The semiconductor package is then singulated.

In some embodiments, the die attach pad is embedded in molding compound such that an exposed surface of the die attach pad is at a bottom of the semiconductor package, and the molding compound between the die attach pad and contacts nearest to the die attach pad extends from the exposed surface of the die attach pad towards the contacts. The molding compound between the die attach pad and the contacts near the die attach pad include a step feature, which is a transition between a first bottom surface and a second bottom surface of the molding compound. The step feature occurs before or at the edge of the contacts near the die attach pad.

In some embodiments, each tie bar extends from a corner of the die attach pad, and wherein after the bottom surface is etched, the plurality of contacts include corner contacts that are active. In some embodiments, all contacts are not exposed at sides of the semiconductor package. Alternatively, all or some portion of the contacts are exposed at the sides of the semiconductor package.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein or with equivalent alternatives.

Reference will now be made in detail to implementations of the present invention as illustrated in the accompanying drawings. The same reference indicators will be used throughout the drawings and the following detailed description to refer to the same or like parts.

Embodiments of the present invention are directed to a thermal leadless array package with die attach pad locking feature and methods of producing the same. A copper layer is half-etched on both surfaces to define an array of package contacts and a die attach pad. Each die attach pad is fully embedded in encapsulating material to provide a positive mechanical locking feature for better reliability. The first half etching is done on a top surface of a leadframe to form the contacts and the die attach pad. The second half-etching is done on a bottom surface of the leadframe, including areas between edges of the die attach pad and the nearest row of contacts. These areas are etched through, with the exception of support structures (e.g., tie bars). In some embodiments, each tie bar is substantially at the center of each side of the die attach pad. Alternatively, each tie bar is at the corner of the die attach pad. This single-layer leadframe substrate can then be used for assembling leadless semiconductor packages. The remainder of the package assembly processes (e.g., die attach, wire bond, molding, marking and/or strip testing) can be done using standard QFN processes and equipment. Back etching is done in strip form to define and isolate the individual contacts from one another and from the die attach pad. In some embodiments, four active corner contacts are thus formed.

Modified Multi-Row QFN Package

Figure 1:
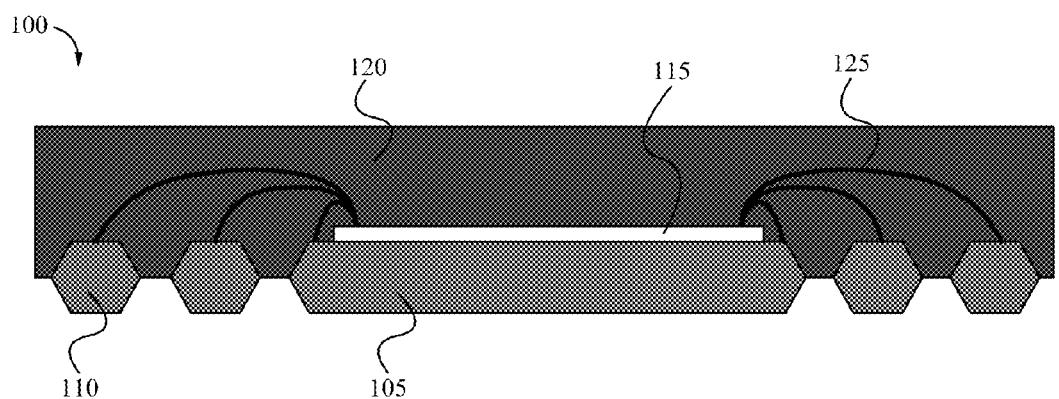
FIG. 1 illustrates a side view of a multi-row leadless package in the prior art.
Figure 2A:
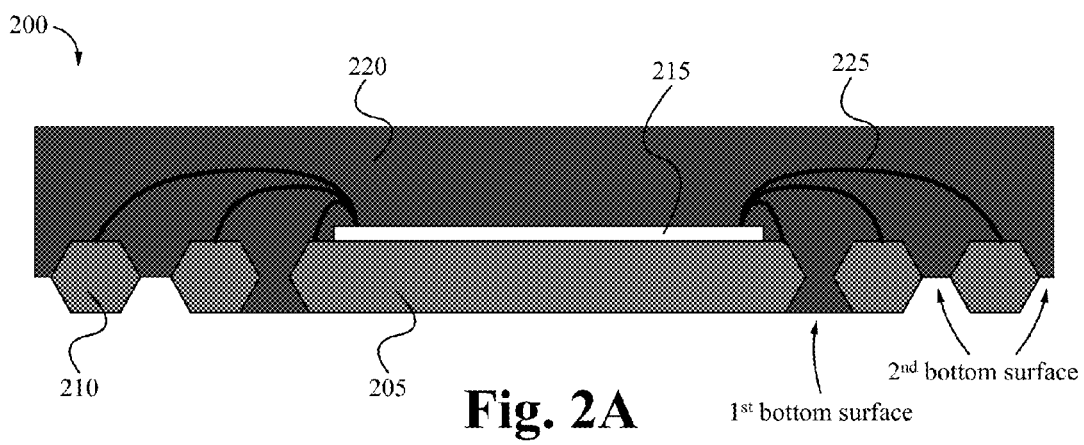
FIG. 2A illustrates a side view of a modified multi-row leadless package in accordance with the present invention.

FIG. 2A illustrates a side view of a modified multi-row leadless package in accordance with the present invention. The semiconductor package 200 includes a die attach pad 205, contacts 210, an IC chip 215 mounted on the die attach pad 205, and wirebonds 225 bonding the chip 215 to the contacts 210. Molding compound 220 encapsulates the wirebonds 225 and the IC chip 215. The die attach pad 205 is fully embedded in and is not protruding from the bottom of the molding compound 220. The die attach pad 205 is preferably exposed only on a single surface, specifically, at the bottom of the package 200. The exposed surface of the die attach pad 205 typically is flush or coplanar with a first bottom surface of the molding compound 220 for a better mechanical locking feature. The first bottom surface of the molding compound 220 extends from the exposed surface of the die attach pad 205 towards the contacts 210. As illustrated, the die attach pad 205 and the contacts 210 are preferably lying on the same plane.

A portion of the contacts include inner contacts that surround the die attach pad 205. The inner contacts are those contacts close or near to the die attach pad 205. As illustrated in FIG. 2A, the molding compound between the die attach pad 205 and the inner contacts, the die attach pad 205, and bottom surfaces of the inner contacts are preferably all coplanar. Preferably, none of the contacts 210 are exposed on the sides of the semiconductor package 200. In some embodiments, as shown in FIG. 2A, the inner contacts are partially encapsulated at the sides of their stand-off surface nearer to the die attach pad 205 while all other contacts (e.g., outer contacts) fully protrude out from the molding compound 220 by a certain distance. The first bottom surface of the molding compound 220 extends from the die attach pad 205 and reaches the inner contacts. A step feature, where the first bottom surface of the molding compound 220 transitions to a second bottom surface of the molding compound 220, occurs at the edge of the inner contacts.

Figure 3A:
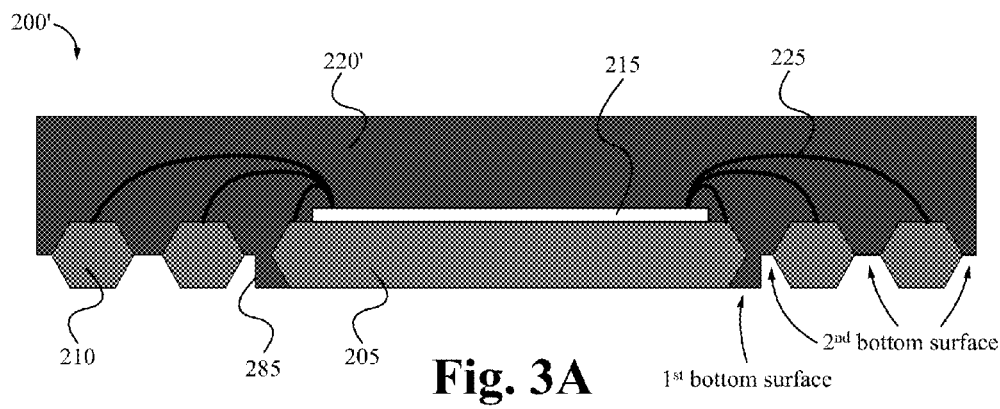
FIGS. 3A-3C illustrates another modified multi-row leadless package and selected processing steps of manufacturing the same in accordance with the present invention.

Alternatively, as illustrated in FIG. 3A, the molding compound 220' between the die attach pad 205 and the inner contacts can include a step feature 285, which is an indentation adjacent to the inner contacts, to facilitate soldering and mounting to a printed circuit board. The step feature 285 forms a second bottom surface of the molding compound 220'. The first bottom surface of the molding compound 220' extends from the die attach pad 205 but does not reach the inner contacts. Instead, the second bottom surface of the molding compound 220' extends from the inner contacts towards the exposed surface of the die attach pad 205. The first bottom surface of the molding compound 220' and the second bottom surface of the molding compound 220' meet to form the step feature 285. The step feature 285 occurs before the inner contacts. The second bottom surface of the molding compound 220' is typically recessed with respect to the bottom surfaces of the inner contacts and the die attach pad 205. In this embodiment, all the contacts 210 are not encapsulated at their stand-off surface. Instead, the contacts 210 protrude outwardly from the molding compound 220' by a certain distance.

Figure 2B:
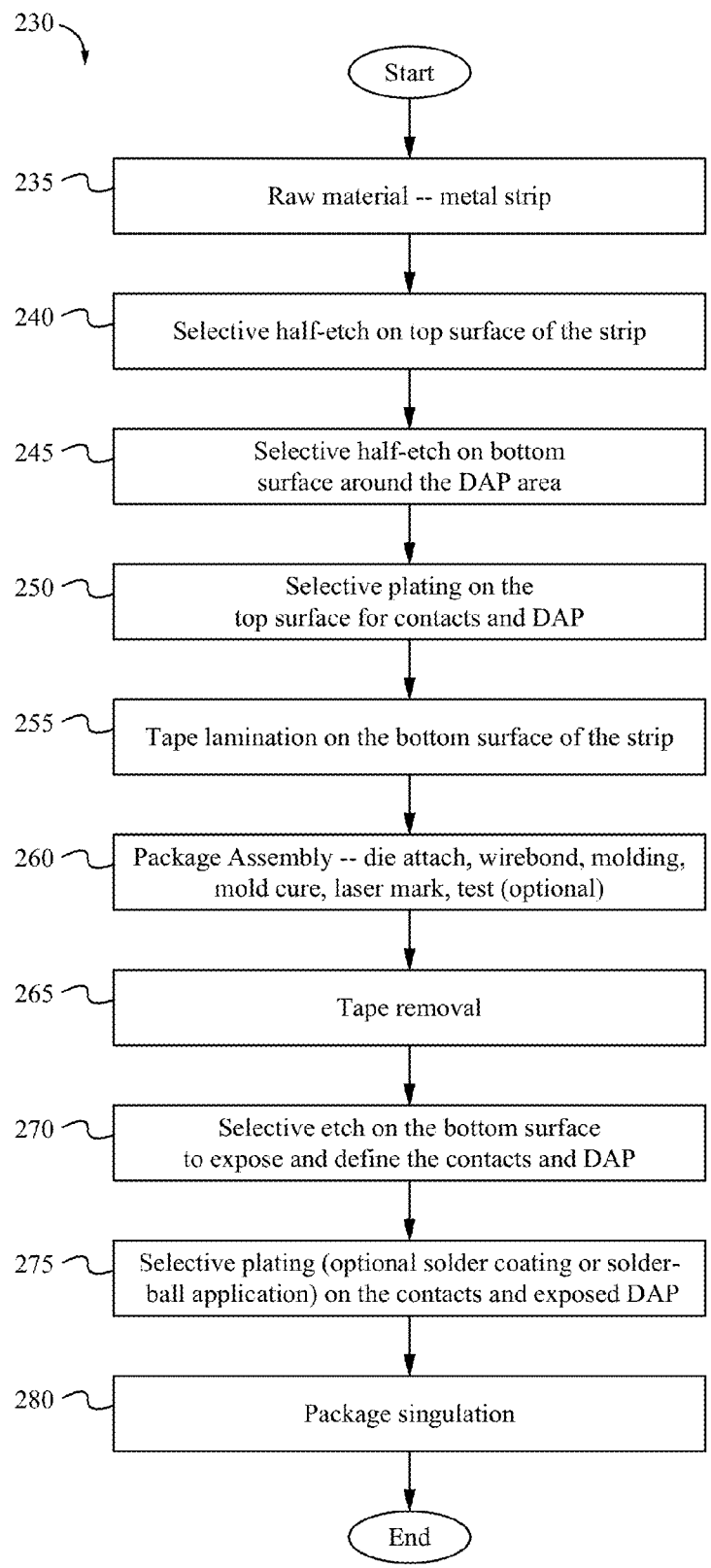
FIGS. 2B-2F illustrate the processing steps of manufacturing the modified multi-row leadless package of FIG. 2A in accordance with the present invention.

FIGS. 2B-2F illustrate the processing steps of manufacturing the modified multi-row leadless package 200 of FIG. 2A in accordance with the present invention. Specifically, FIG. 2B illustrates a method of manufacturing the modified multi-row leadless package 200 of FIG. 2A in accordance with the present invention, while FIGS. 2C-2F illustrate exemplary results produced by each step of the method of FIG. 2B.

Figure 2C:
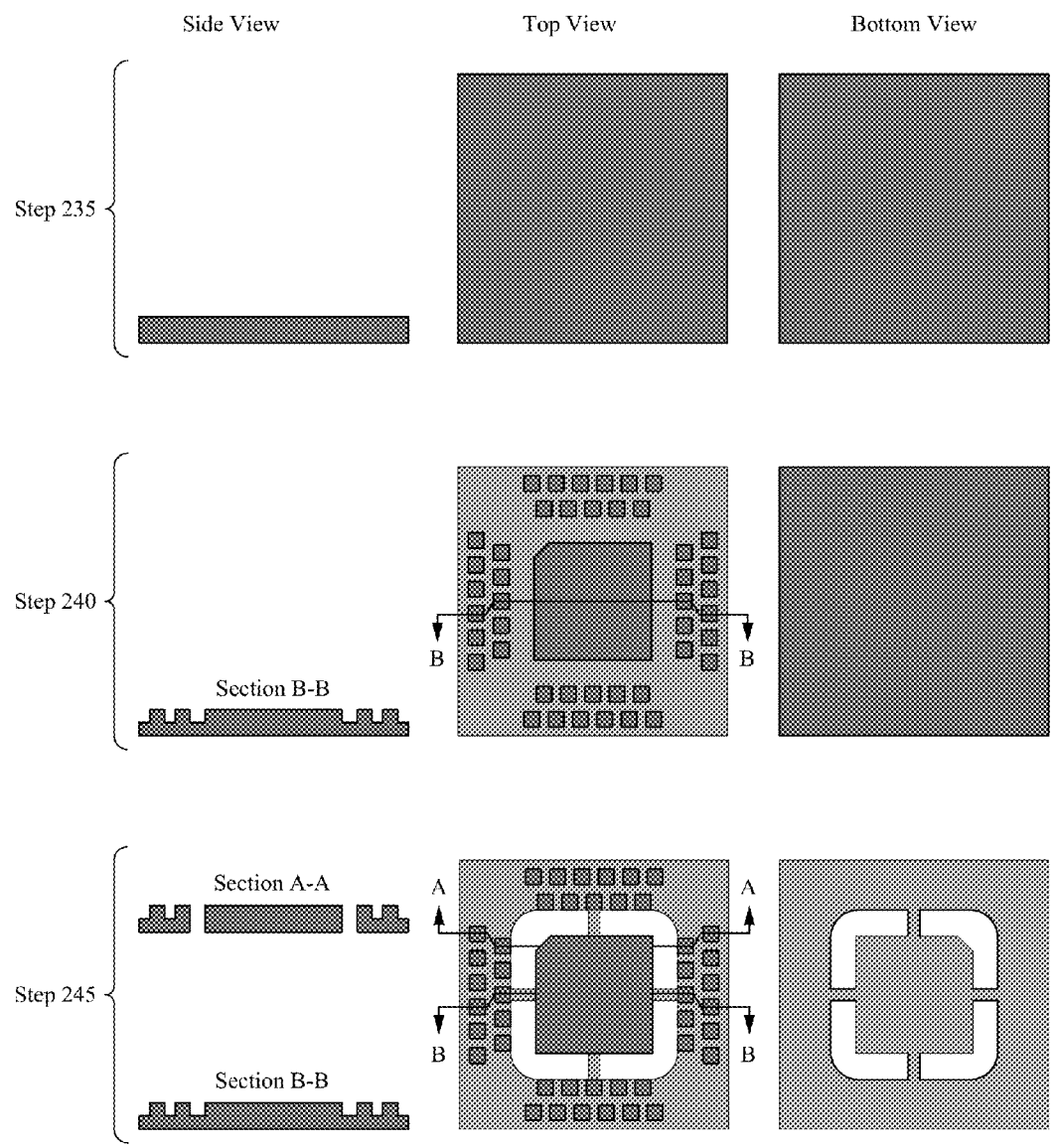
Figure 2D:
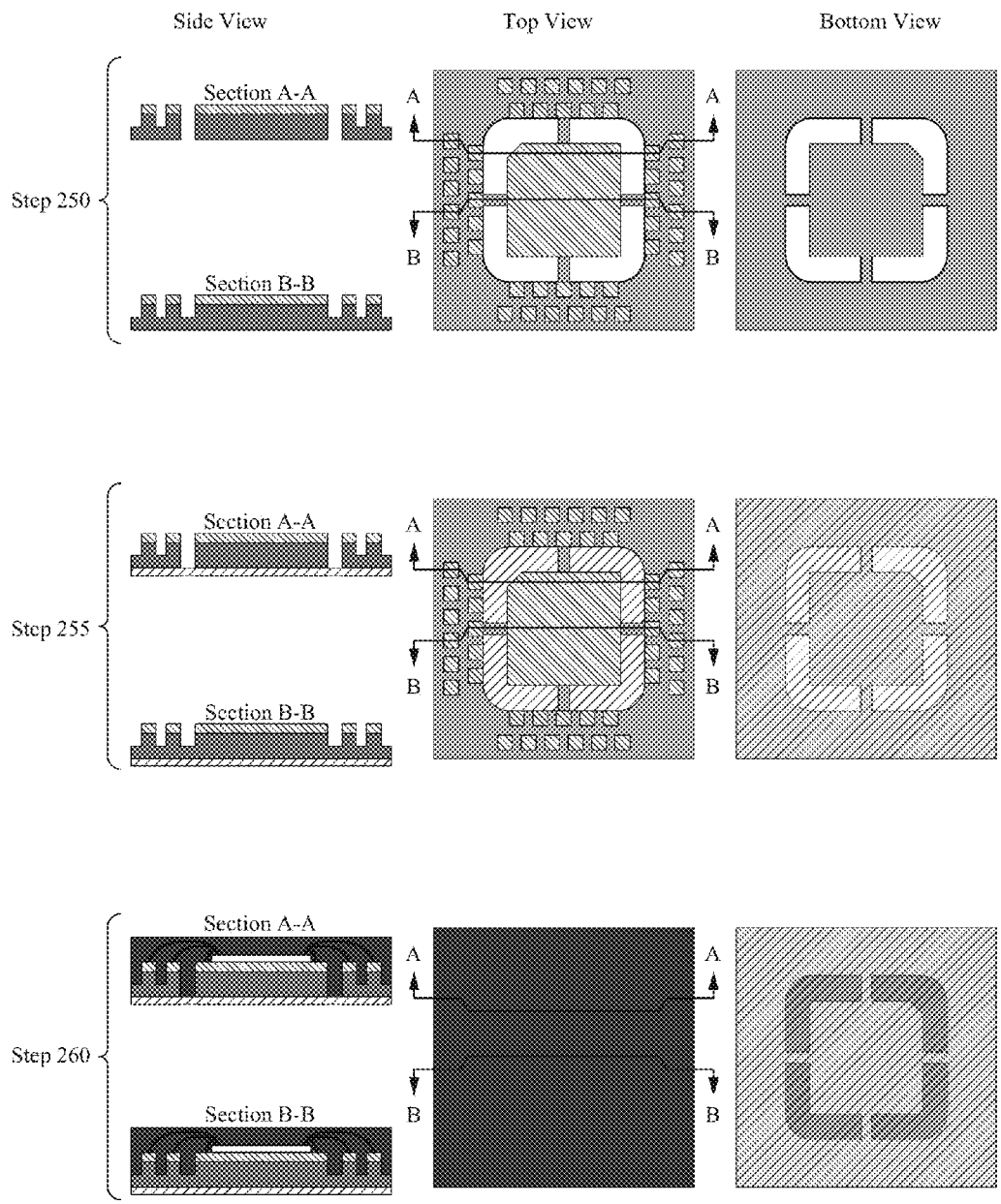
Figure 2E:
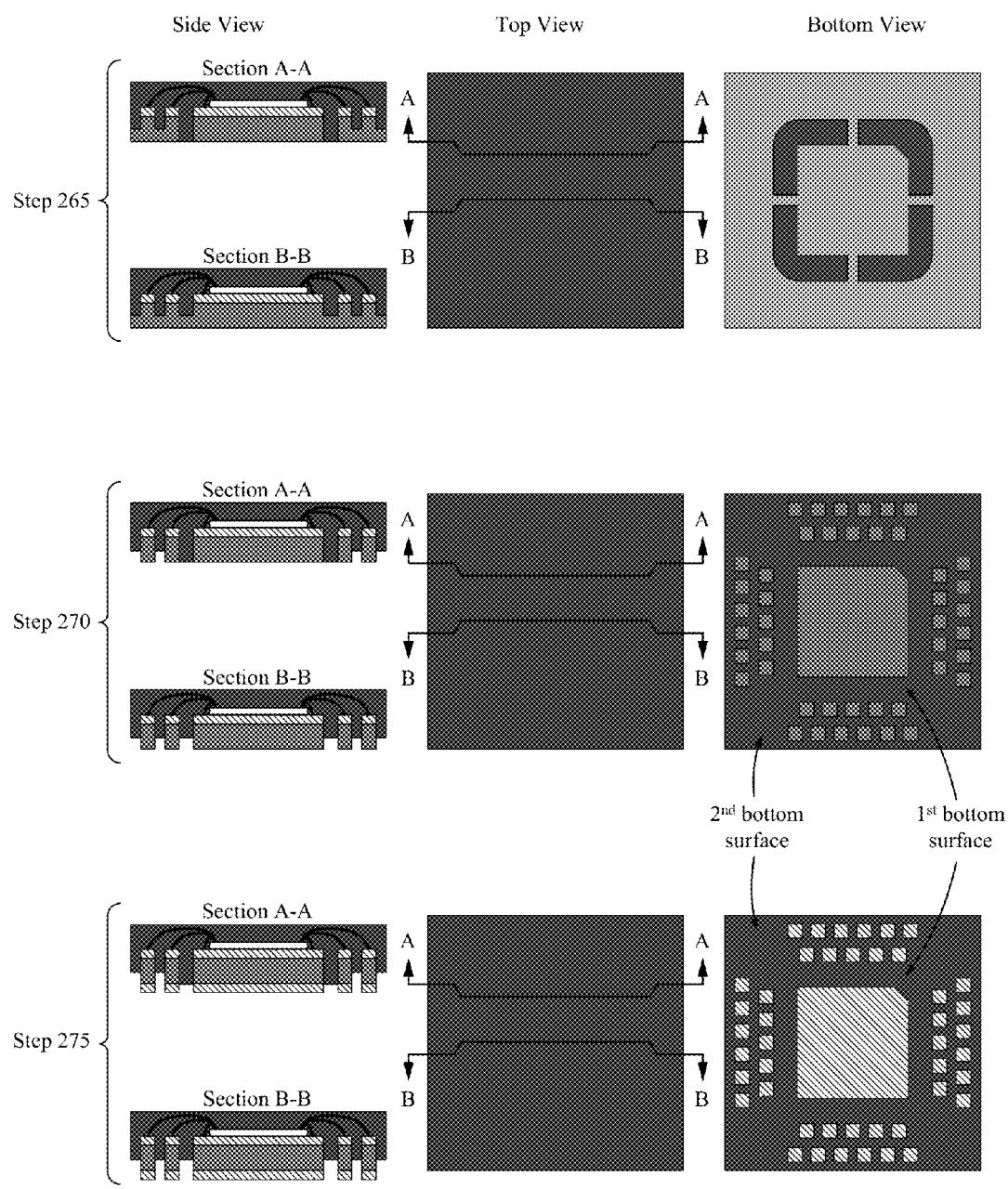

As illustrated in FIG. 2B, the method 230 begins at a step 235, where a metal strip is provided. Preferably, the metal layer is formed from a sheet of bare copper or some other metal, such as Alloy 42. FIGS. 2C-2E show only one unit within the metal strip. These units are typically arranged in an array format within the metal strip.

At a step 240, a top surface of the metal strip is selectively half-etched using, for example, photo resist (PR) masks. A PR mask prevents areas on the metal strip from being etched away. Typically, the top surface is etched based on specific customer design. The etched areas are shown in a lighter shade of gray in FIG. 2C. This step and the subsequent steps occur simultaneously on all the units within the metal strip.

At a step 245, a bottom surface of the metal strip is selectively half-etched around the perimeter of the die attach pad using, for example, PR masks. In some embodiments, this half-etch area overlays with the initial half-etch pattern on the top surface of the metal strip to from etched-through areas around the perimeter of the die attach pad and tie bars that hold the die attach pad to the leadframe. In some embodiments, a minimum of four tie bars are formed, with each holding one side of the quadrilateral die attach pad. The etched-through areas advantageously allow for molding compound, during encapsulation, to reach from the top to the bottom of the leadframe and surround the sides of the die attach pad.

Figure 3B:
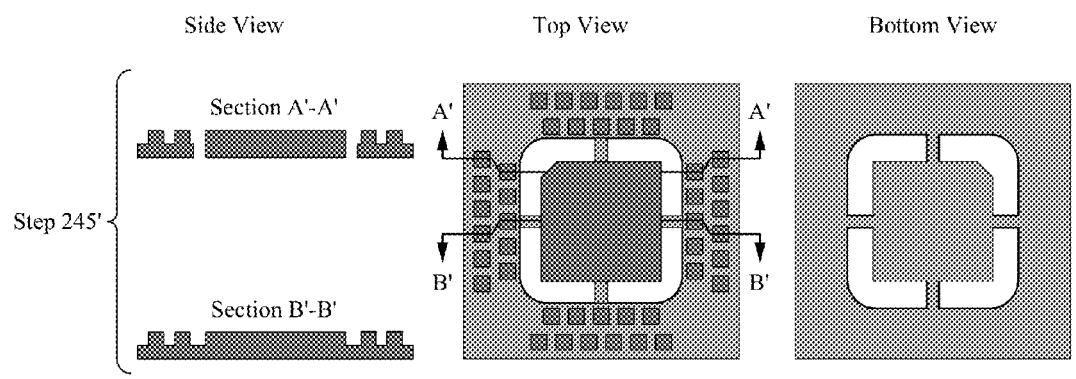

In some embodiments, the etched through areas extend from the die attach pad to the inner contacts, which results in the inner contacts to be partially encapsulated at the sides of their stand-off, as illustrated in FIG. 2A. These etched through area create a step feature at the edge of the inner contacts. Alternatively, as illustrated in FIG. 3B, the etched through areas are narrower than those illustrated in FIG. 2C. These narrower etched through areas create a step feature before the inner contacts, which results in the inner contacts to be fully protruding out of the molding compound, as illustrated in FIG. 3A.

In some embodiments, the step 240 and the step 245 are performed simultaneously. Specifically, PR masks are applied to both sides of the leadframe and both sides of the leadframe are simultaneously etched. This is known as a single step etching.

In some embodiments, alternatively to performing the step 245, a PR mask can be applied to the top surface and the top side is again selectively etched to create the through openings around the die attach pad. No bottom surface partial etching is thus required.

At a step 250, the top surface of the metal strip is selectively plated for the contacts and/or die attach pad. In some embodiments, the plating comprises Ni, Pd and Au. However, one of ordinary skill will recognize other platings, such as, for example, NiPdAu alloy, NiAu, or NiAu alloy are contemplated. The plating on the contacts is for wirebonds. The plating on the die attach pad is optional as the die attach pad can be bare copper for designs with no downbonds, or can be full plated or selectively plated (e.g., on peripheral area of the die attach pad) for downbond purposes, which are all based on specific customer design.

At a step 255, the bottom surface of the metal strip is tape laminated to prevent molding compound from bleeding underneath the strip, through the open "through-hole" or etched-through areas around the periphery of the die attach pad.

At a step 260, the semiconductor package is prepared or assembled. Preparing the semiconductor package includes attaching an IC chip to the die attach pad, wirebonding, molding, post mold curing, laser marking and, optionally, strip testing.

At a step 265, the tape is removed by peeling off from the bottom surface of the metal strip after the molding process.

At a step 270, the bottom surface is selectively etched using, for example PR masks, to expose and define the contacts and the die attach pad. Typically, the contacts are thereafter electrically isolated from one another and from the die attach pad. The units can be electrically tested in strip form, if desired, due to this isolation.

At a step 275, solderable material is applied to the bottom surface. In some embodiments, the exposed contacts and the die attach pad on the bottom surface are selectively plated with tin, solder, NiAu, NiPdAu, Ag or other solderable materials for printed circuit board mounting purposes. Solder paste coating or solder balls application are also suitable options.

Figure 2F:
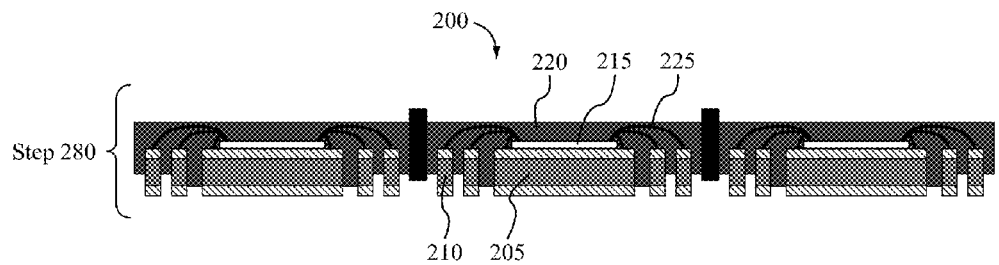
Figure 3C:
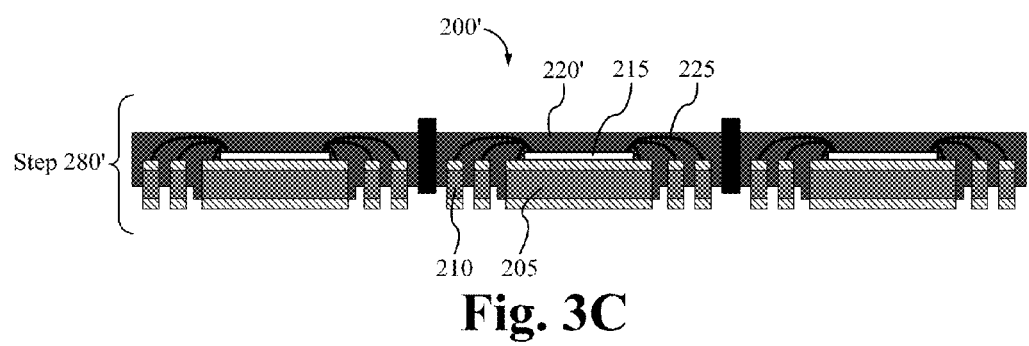
Figure 4:
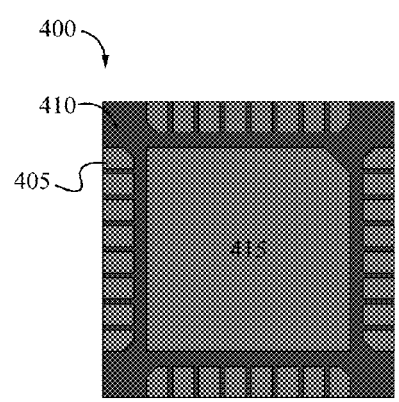
FIG. 4 illustrates a bottom view of a single row leadless package in the prior art.

At a step 280, the package is singulated. The devices within the strip are singulated from each other to form individual finished devices. Singulation is done using high-speed saw, laser, high-pressure water jet or some other suitable means. FIG. 2F illustrates singulation of the semiconductor device 200, while FIG. 3C illustrates singulation of the semiconductor device 200'. The process 230 ends after the step 280.

A singulated semiconductor device 200 is illustrated in FIG. 2A. As discussed above, the packaged semiconductor package 200 includes a die attach pad 205, contacts 210, an IC chip 215 mounted on an inner surface of the die attach pad 205, and wirebonds 225 bonding the chip 215 to the contacts 210. Molding compound 220 encapsulates the wirebonds 225 and the IC chip 215. The die attach pad 205 is fully embedded in and is not protruding from the bottom of the molding compound 220. The die attach pad 205 includes an exposed surface at the bottom of the package 200. The exposed surface of the die attach pad 205 typically is flush or coplanar with the first bottom surface of the molding compound 220. The first bottom surface of the molding compound 220 extends from the exposed surface of the die attach pad 205 towards and reaches the inner contacts. A step feature, where the first bottom surface of the molding compound 220 transitions to a second bottom surface of the molding compound 220, occurs at the edge of the inner contacts.

A singulated semiconductor device 200' is illustrated in FIG. 3A. As discussed above, the packaged semiconductor package 200' includes a die attach pad 205, contacts 210, an IC chip 215 mounted on an inner surface of the die attach pad 205, and wirebonds 225 bonding the chip 215 to the contacts 210. Molding compound 220' encapsulates the wirebonds 225 and the IC chip 215. The die attach pad 205 is fully embedded in and is not protruding from the bottom of the molding compound 220'. The die attach pad 205 includes an exposed surface at the bottom of the package 200'. The exposed surface of the die attach pad 205 typically is flush or coplanar with the first bottom surface of the molding compound 220'. The first bottom surface of the molding compound 220' extends from the exposed surface of the die attach pad 205 towards but does not reach the inner contacts. Instead, the second bottom surface of the molding compound 220' extends from the inner contacts towards the exposed surface of the die attach pad 205. The first bottom surface of the molding compound 220' and the second bottom surface of the molding compound 220' meet to form the step feature. The step feature occurs before the inner contacts.

A modified multi-row leadless package 200, 200' has a die attach pad fully embedded in molding compound for a more robust locking feature. An exposed surface of the die attach pad, which is at a bottom of the package, is flush with the molding compound. A portion or all of the terminal contacts are partly embedded in the molding compound and protrude by a certain distance away from the molding compound. In some embodiments, a step feature between the die attach pad and the inner contacts facilitates soldering and mounting to a printed circuit board. The leadframe fabrication step is preferably a combination of through-etch and half-etch.

Modified Single Row QFN Package

Figure 5A:
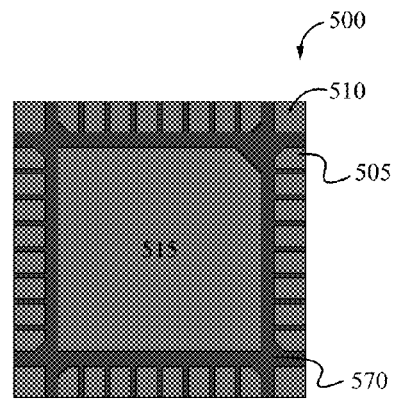
FIG. 5A illustrates a bottom view of a modified single row leadless package in accordance with the present invention.

FIG. 5A illustrates a bottom view of a modified single row leadless package in accordance with the present invention. The semiconductor package 500 in this example has four additional active contacts 505 compared to the prior art single row leadless package 400. The four additional contacts 505 are typically located at the corners 510 of the package 500. As discussed below, all contacts 505 and the die attach pad 515 are preferably lying on the same plane and are flush with the molding compound 570. All contacts 505 are exposed on the sides of the package 500.

Figure 5B:
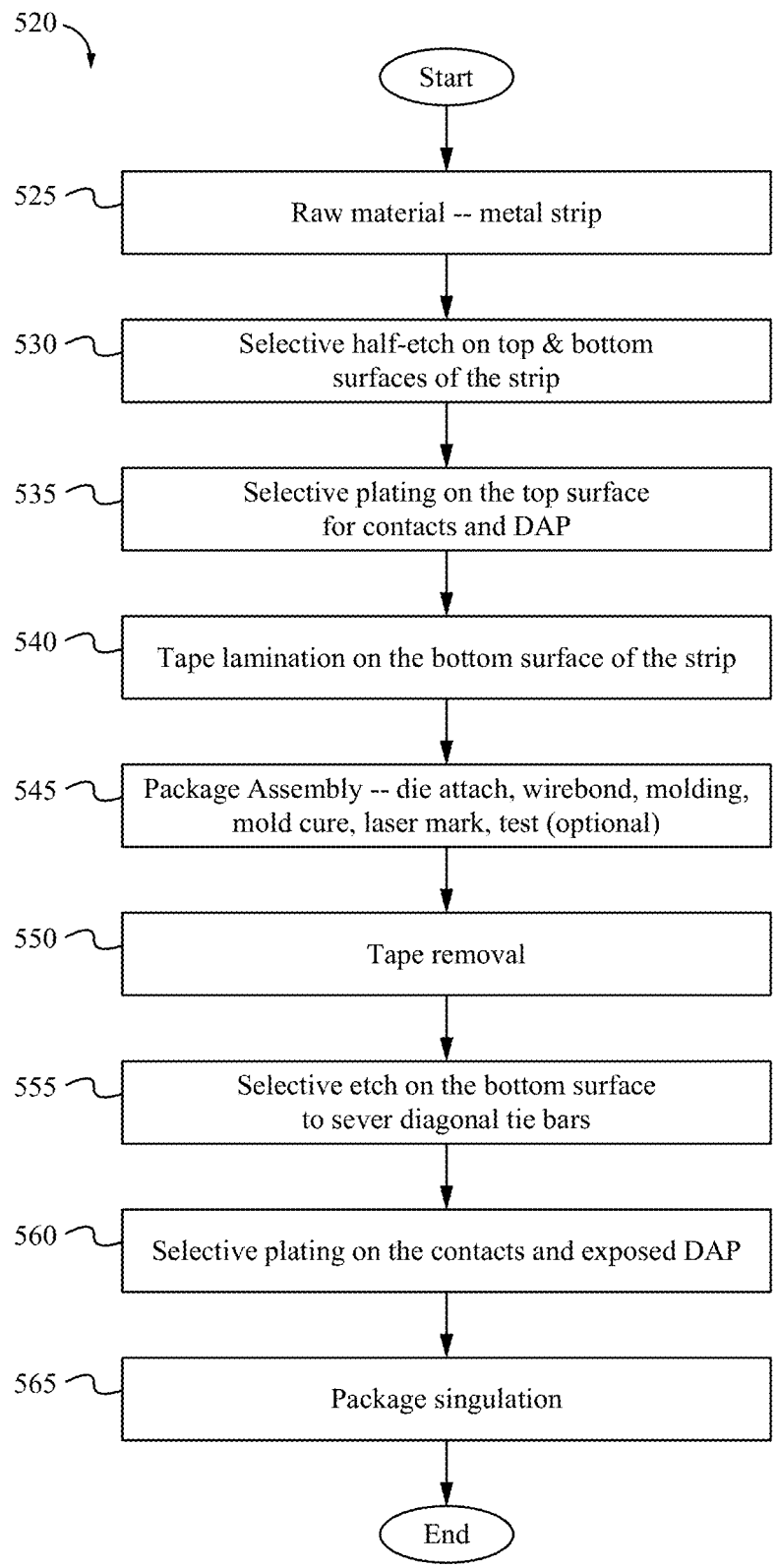
FIGS. 5B-5F illustrate the processing steps of manufacturing the modified single row leadless package of FIG. 5A in accordance with the present invention.

FIGS. 5B-5F illustrate the processing steps of manufacturing the modified single row leadless package 500 of FIG. 5A in accordance with the present invention. Specifically, FIG. 5B illustrates a method of manufacturing the modified single row leadless package 500 of FIG. 5A in accordance with the present invention, while FIGS. 5C-5F illustrate exemplary results produced by each step of the method of FIG. 5B.

Figure 5C:
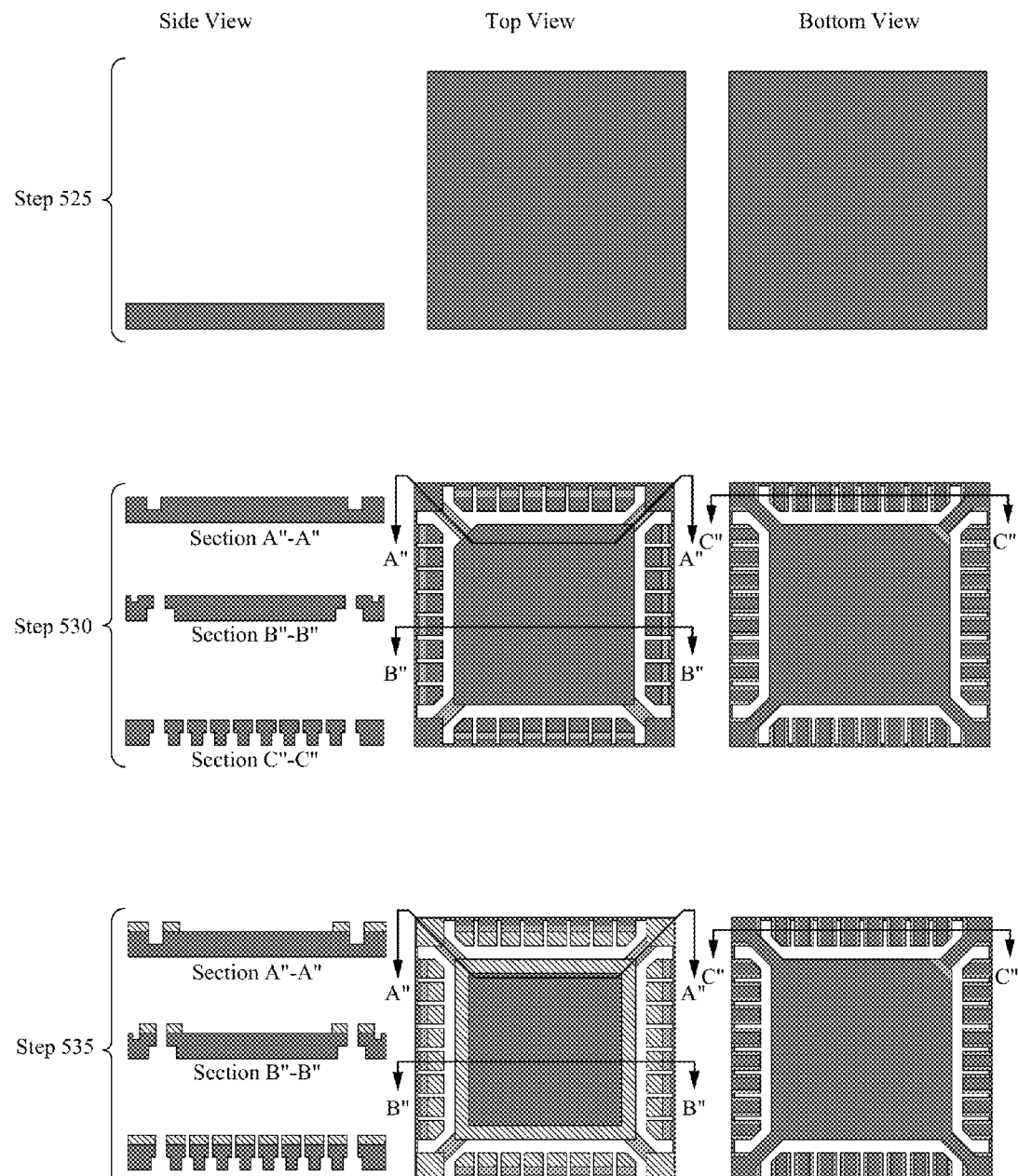
Figure 5D:
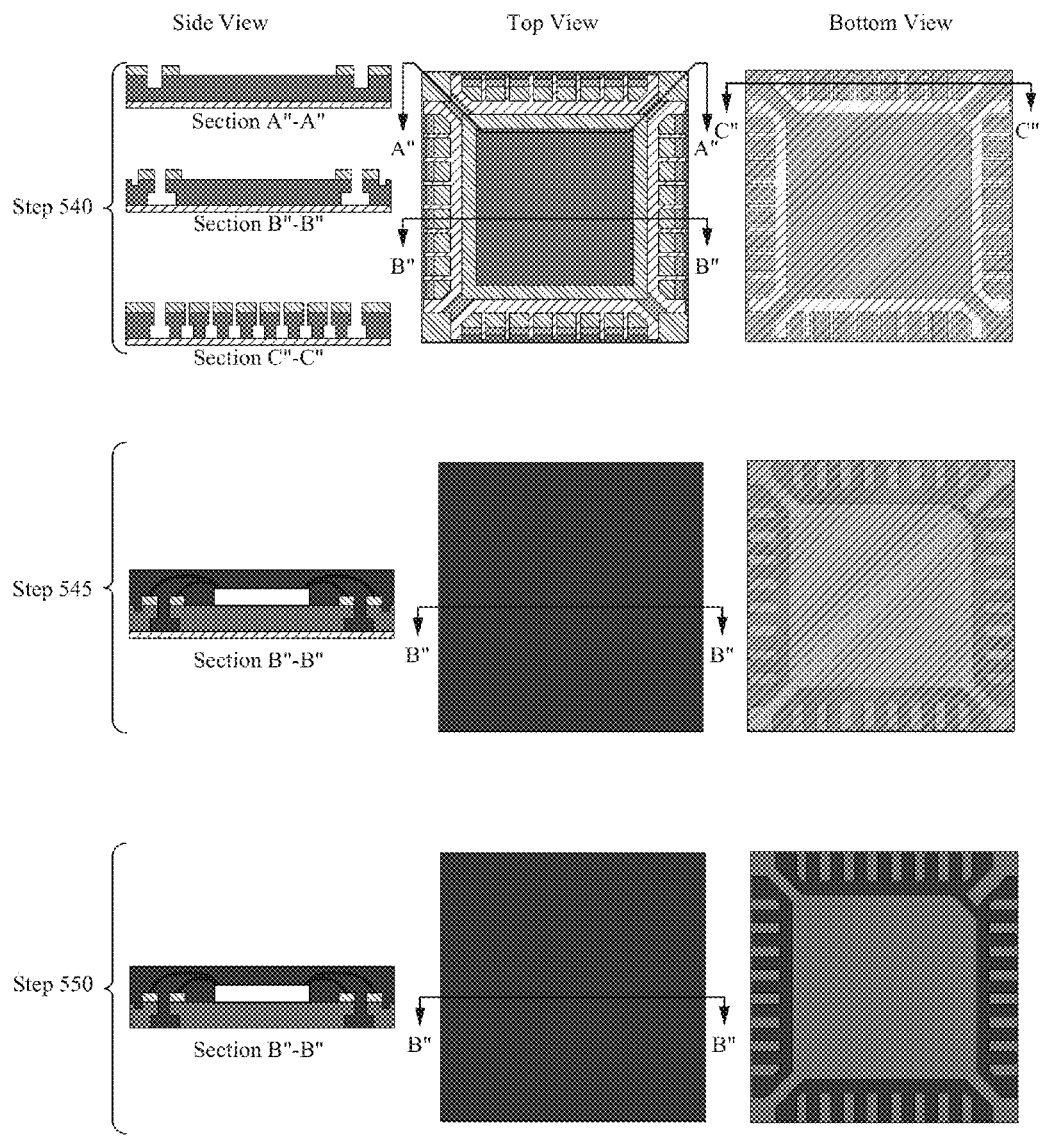
Figure 5E:
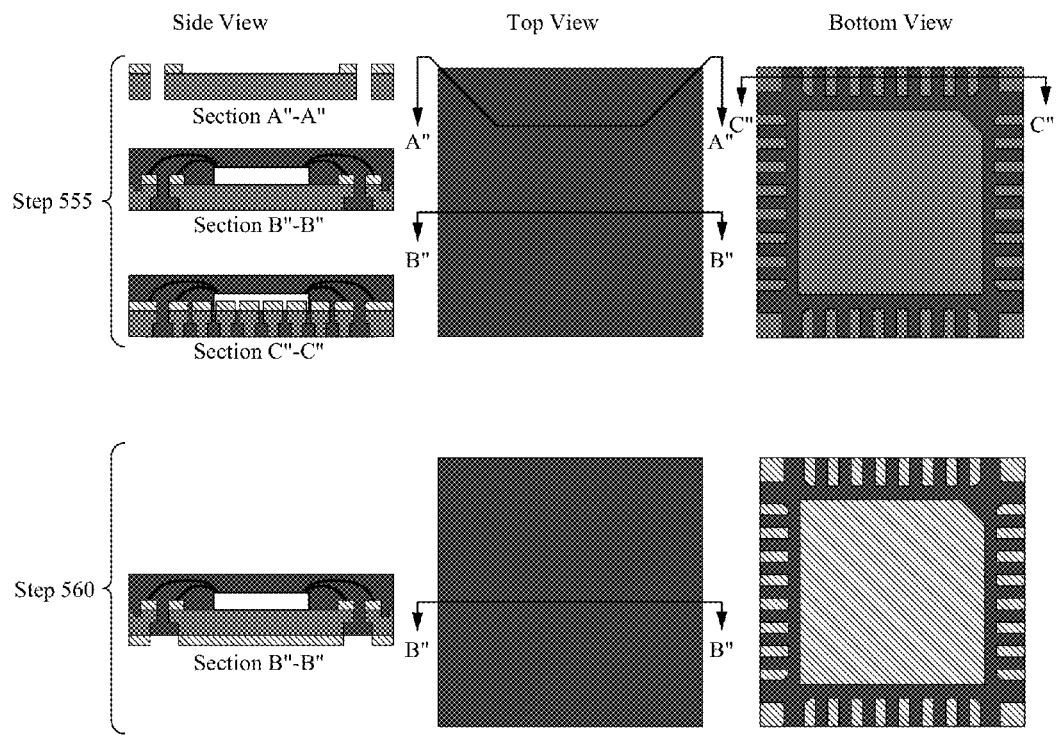

As illustrated in FIG. 5B, the method 520 begins at a step 525, where a metal strip is provided. Preferably, the metal layer is formed of a sheet of bare copper or some other metal, such as Alloy 42. FIGS. 5C-5E show only one unit within the metal strip. These units are typically arranged in an array format within the metal strip.

At a step 530, a top surface and a bottom surface of the metal strip are selectively half-etched using, for example, PR masks. Typically, the top and bottom surfaces are etched based on specific customer design. The half-etched areas are shown in a lighter shade of gray in FIG. 5C. Contact pads, a die attach pad, and four tie bars extending from the corners of the die attach pad to the leadframe are created. Typically, the tie bars connect the die attach pad to the lead frame. In some embodiments, etched-through areas are created around the perimeter of the die attach pad and between the contact pads. The etched-through areas advantageously allow for molding compound, during encapsulation, to reach from the top to the bottom of the leadframe and surround sides of the die attach pad. The surfaces can be etched simultaneously or separately.

At a step 535, the top surface of the metal strip is selectively plated for the contacts and/or die attach pad. Typically, the plating of the top surface is Ag or a stack-up of Ni, Pd and Au. However, one of ordinary skill will recognize other platings, such as, for example, NiPdAu alloy, NiAu, or NiAu alloy are contemplated. The plating on the contacts is for wirebonds. The plating on the die attach pad is optional as the die attach pad can be bare copper for designs with no downbonds, or can be full plated or selectively plated (e.g., on peripheral area of the die attach pad) for downbond purposes, which are all based on specific customer design. FIG. 5C illustrates the die attach pad with peripheral plating.

At a step 540, the bottom surface of the metal strip is tape laminated to prevent mold compound from bleeding underneath the strip, through the open "through-hole" or etched-through areas.

At a step 545, the semiconductor package is prepared or assembled. Preparing the semiconductor package includes attaching an IC chip to the die attach pad, wirebonding, molding, post mold curing, laser marking and, optionally, strip testing.

At a step 550, the tape is removed by peeling off from the bottom surface of the metal strip after the molding process.

At a step 555, the bottom surface is selectively etched using, for example PR masks, to sever the four diagonal tie bars from the die attach pad, leaving four active corner terminals. Typically, the contacts are thereafter electrically isolated from one another and from the die attach pad. The units can be electrically tested in strip form, if desired, due to this isolation.

At a step 560, solderable material is applied to the bottom surface. In some embodiments, the exposed contacts and the die attach pad on the bottom surface are selectively plated with Sn, SnPb, NiAu, NiPdAu, Ag or other solderable materials, including Pb-free compositions like SnAgCu and SnAgCuNi, for printed circuit board mounting purposes. Solder paste coating or solder balls application onto the exposed contacts are also suitable options.

At a step 565, the package is singulated. The devices within the strip are singulated from each other to form individual finished devices. Singulation is done using high-speed saw, laser, high-pressure water jet or some other suitable means.

A modified single row leadless package 500 has a die attach pad and contacts fully embedded in molding compound for a more robust locking feature. Exposed surfaces of the die attach pad and contacts are preferably coplanar with molding compound. The package substantially utilizes all valuable footprint space of the package. Particularly, the package has additional I/O leads at the corners of the package.

Figure 5F:
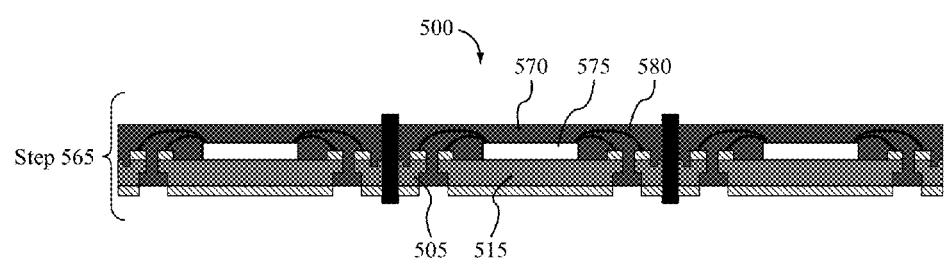

As illustrated in FIG. 5F, the semiconductor package 500 includes a die attach pad 515, contacts 505, an IC chip 575 mounted on an inner surface of the die attach pad 515, and wirebonds 580 bonding the chip 575 to the contacts 505. Molding compound 570 encapsulates the wirebonds 580 and the IC chip 575. The die attach pad 515 and the contacts 505 are fully embedded in and are not protruding from the bottom of the molding compound 570. Bottom surfaces of the die attach pad 515 and contacts 505 are flush or coplanar with a bottom surface of the molding compound 570. The die attach pad 515 and the contact pads 505 have an engaging feature. Put differently, the die attach pad 515 and the contact pads 505 are etched such that they are tiered to fully lock with the molding compound. The leadframe fabrication step is a combination of through-etch and half-etch.

Advantages

The present invention teaches an alternative leadframe fabrication process and assembly method, resulting in the TLA structure having a similar mechanical locking feature to that of a standard QFN. This results in reliability robustness in TLA packages. Comparable reliability level as a standard QFN is achieved without having to reduce the die-to-DAP ratio (e.g., reducing the maximum die size possible for a given DAP size.) In other words, the present invention allows the biggest die size possible for a multi-row leadless package.

Furthermore, the present invention has the same design flexibility as prior art multi-row package, where the package can be designed around the IC chip. This packaging technology can achieve up to 85% reduction in board area, dramatically reduced total signal lengths, a lower cost per I/O wire bonded package, and a much higher I/O count per body size in a lead frame-based package. TLA can replace existing packages, such as dual-row QFN, large-body QFN, QFPs, FBGA's and power QFN. The present invention is also extendable to advanced applications, such as MCM, SIP, Stack Die and Flip Chip. The present invention also uses the same equipment and process as a standard QFN. Custom designs do not require any hard tooling and thus no capital investment is required.

For single row QFN, the present invention teaches a leadframe fabrication process and assembly method that removes the tie bars and isolates the 4 corner contacts to provide 4 additional I/O leads.

Although this discussion covers both the methods and structures for a single or multi-row leadless package, specifically towards a TLA package, it should be understood that this invention can be extended to high density leadframe array (HLA) and standard QFN.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A method of fabricating a semiconductor package comprising:
   etching a leadframe to form a plurality of tie bars, a plurality of contacts and a die attach pad coupled to a portion of the plurality of contacts via the plurality of tie bars, and to form a plurality of areas around the die attach pad that are etched through the leadframe;
   selectively plating a top surface of the leadframe;
   laminating the bottom surface of the leadframe with tape;
   preparing the semiconductor package;
   etching a bottom surface of the leadframe to isolate the plurality of contacts from the die attach pad; and
   singulating the semiconductor package.

2. The method of claim 1, wherein the top surface is plated with Ag, a stack-up of Ni, Pd and Au, NiPdAu alloy, NiAu, or NiAu alloy.

3. The method of claim 1, further comprising, after preparing the semiconductor package, removing the tape from the bottom surface of the leadframe.

4. The method of claim 3, further comprising, after etching the bottom surface of the leadframe, selectively applying solderable material to the bottom surface of the leadframe.

5. The method of claim 4, wherein the solderable material is Sn, NiAu, NiPdAu, Ag, SnPb, SnAgCu, SnAgCuNi, or Pb-free compositions.

6. The method of claim 1, wherein preparing the semiconductor package includes:
   coupling a die to the die attach pad;
   wirebonding the die to the plurality of contacts; and
   encapsulating the die attach pad, the plurality of contacts, the die and wirebonds.

7. The method of claim 1, wherein the portion of the mold compound forming the lower bottom surface extends from the die attach pad to the inner row of contacts.

8. A method of fabricating a semiconductor package comprising:
   etching a leadframe to form a plurality of tie bars, a plurality of contacts, and a die attach pad coupled to a portion of the plurality of contacts via the plurality of tie bars, and to form a plurality of areas around the die attach pad that are etched through the leadframe;
   preparing the semiconductor package;
   etching a bottom surface of the leadframe to isolate the plurality of contacts from the die attach pad; and
   singulating the semiconductor package, wherein the singulated semiconductor package comprises:
      a lower bottom surface aligned with a first level and formed by the bottom of the die attach pad and a first portion of the mold compound; and
      an upper bottom surface aligned with a second level higher than the first level and formed at least partially by a second portion of the mold compound;
   wherein, between the die attach pad and the inner row of contacts, the bottom of the mold compound includes a step between the first level and the second level.

9. A method of fabricating a semiconductor package comprising:
   etching a leadframe to form a plurality of tie bars, a plurality of contacts and a die attach pad coupled to a portion of the plurality of contacts via the plurality of tie bars, and to form a plurality of areas around the die attach pad that are etched through the leadframe, wherein the plurality of contacts include one or more corner contacts located on the vertex of one or more of the corners of the leadframe;

preparing the semiconductor package including coupling a die to the die attach pad;

etching a bottom surface of the leadframe including the tie bars to isolate the plurality of contacts including the corner contacts from the die attach pad;

electrically coupling the die to at least one of the corner contacts; and singulating the semiconductor package;

wherein each of the tie bars extend from a corner of the die attach pad to one of the corner contacts.

10. The method of claim 1, wherein all contacts are not exposed at sides of the semiconductor package.

11. The method of claim 1, wherein all contacts are exposed at sides of the semiconductor device.

\* \* \* \* \*